United States Patent
Lee et al.

(10) Patent No.: US 11,443,785 B2
(45) Date of Patent: Sep. 13, 2022

(54) MEMORY DEVICE FOR GENERATING DATA STROBE SIGNAL BASED ON PULSE AMPLITUDE MODULATION, MEMORY CONTROLLER, AND MEMORY SYSTEM INCLUDING THE SAME

(71) Applicant: SAMSUNG ELECTRONICS CO., LTD., Suwon-si (KR)

(72) Inventors: Sucheol Lee, Suwon-si (KR); Jaewoo Park, Yongin-si (KR); Younghoon Son, Yongin-si (KR); Youngdon Choi, Seoul (KR); Junghwan Choi, Hwaseong-si (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/344,610

(22) Filed: Jun. 10, 2021

(65) Prior Publication Data

US 2022/0068332 A1 Mar. 3, 2022

(30) Foreign Application Priority Data

Sep. 2, 2020 (KR) .................. 10-2020-0111462

(51) Int. Cl.
*G11C 7/22* (2006.01)
*G11C 7/10* (2006.01)
*H03K 19/17736* (2020.01)
*H03K 19/017* (2006.01)
*H03K 19/1776* (2020.01)

(52) U.S. Cl.
CPC ............ *G11C 7/222* (2013.01); *G11C 7/1051* (2013.01); *G11C 7/1096* (2013.01); *H03K 19/01742* (2013.01); *H03K 19/1774* (2013.01); *H03K 19/1776* (2013.01)

(58) Field of Classification Search
CPC ........................................................ G11C 7/22
USPC ........................................................ 365/233.1
See application file for complete search history.

(56) References Cited

U.S. PATENT DOCUMENTS

| | | | | |
|---|---|---|---|---|
| 7,224,737 | B2 * | 5/2007 | Voutilainen | H04L 25/4917 332/115 |
| 7,716,411 | B2 | 5/2010 | Panabaker et al. | |
| 9,794,054 | B2 * | 10/2017 | Nandy | H04L 5/00 |
| 10,242,719 | B2 | 3/2019 | Doo et al. | |
| 10,283,187 | B2 * | 5/2019 | Hollis | G11C 11/4096 |
| 10,297,310 | B2 | 5/2019 | Prakash et al. | |
| 10,447,512 | B2 * | 10/2019 | Lin | G11C 7/20 |
| 2020/0066309 | A1 * | 2/2020 | Mayer | G11C 29/021 |
| 2020/0066318 | A1 | 2/2020 | Hasbun et al. | |
| 2020/0118605 | A1 | 4/2020 | Hollis | |

FOREIGN PATENT DOCUMENTS

KR  101988920 B1  6/2019

* cited by examiner

*Primary Examiner* — Muna A Techane
(74) *Attorney, Agent, or Firm* — Myers Bigel, P.A.

(57) ABSTRACT

A memory device includes a memory cell array and a data input and output circuit configured to output a data signal (DQ signal) including data read from the memory cell array and a data strobe signal (DQS signal) including a toggle pattern associated with an operating condition of the memory device based on n-level pulse amplitude modulation (PAMn), wherein n is an integer greater than or equal to 4.

20 Claims, 18 Drawing Sheets

| Level Selection Signal LSS | Present DQS Level | Next DQS Level |
|---|---|---|
| 1 | V1 | V2 |
| 2 | V1 | V3 |
| 3 | V1 | V4 |
| 4 | V2 | V1 |
| 5 | V2 | V3 |
| 6 | V2 | V4 |
| 7 | V3 | V1 |
| 8 | V3 | V2 |
| 9 | V3 | V4 |
| 10 | V4 | V1 |
| 11 | V4 | V2 |
| 12 | V4 | V3 |

| DQS Level | Pull-UP | | Pull-Down | |
|---|---|---|---|---|
| | PU_MSB | PU_LSB | PD_MSB | PD_LSB |
| V1 | 0 | 0 | 1 | 1 |
| V2 | 0 | 1 | 1 | 0 |
| V3 | 1 | 0 | 0 | 1 |
| V4 | 1 | 1 | 0 | 0 |

MEMORY DEVICE FOR GENERATING DATA STROBE SIGNAL BASED ON PULSE AMPLITUDE MODULATION, MEMORY CONTROLLER, AND MEMORY SYSTEM INCLUDING THE SAME

CROSS-REFERENCE TO RELATED APPLICATION

This application is based on and claims priority under 35 U.S.C. § 119 to Korean Patent Application No. 10-2020-0111462, filed on Sep. 2, 2020, in the Korean Intellectual Property Office, the disclosure of which is incorporated by reference herein in its entirety.

BACKGROUND

The inventive concept relates to a memory device, and more particularly, to a memory device for generating a data strobe signal based on pulse amplitude modulation, a memory controller, and a memory system including the same.

According to a rapid increase in the supply of mobile devices and a sharp increase of Internet access traffic, requests for large-volume and high-speed data transmission have been increasing day by day. However, it is difficult to satisfy the requests for large-volume and high-speed data transmission with signal modulation based on non-return to zero (NRZ) type encoding. Recently, research into pulse amplitude modulation (PAM) has been performed as an alternative of a signaling scheme for large-volume and high-speed data transmission. A technique of storing large-volume data and transmitting data at a high speed in response to a data request is also demanded for a memory system, and data transmission related techniques suitable for the characteristics of a memory system have been researched. In addition, transmission and reception techniques for a data strobe signal to be transmitted and received with a data signal for the stability of high-speed data transmission also have been researched.

SUMMARY

The inventive concept provides a memory device for improving the reliability of data at a reception side by applying pulse amplitude modulation to transmission and reception of a data strobe signal in a memory system and changing a toggle pattern included in the data strobe signal according to an operating condition. A related memory controller and a memory system including the same is provided.

According to some example embodiments of the inventive concept, there is provided a memory device including a memory cell array, and a data input and output circuit configured to output a data signal (hereinafter, a DQ signal) including data read from the memory cell array and a data strobe signal (hereinafter, a DQS signal) including a toggle pattern associated with an operating condition of the memory device based on n-level pulse amplitude modulation (PAMn), where n is an integer greater than or equal to 4.

According to some example embodiments of the inventive concept, there is provided a memory system including a memory device including a memory cell array, and a memory controller configured to control a memory operation of the memory device, wherein the memory device and the memory controller mutually transmit and receive a data strobe signal (hereinafter, a DQS signal) including a different toggle pattern according to an operating condition of the memory system based on n-level pulse amplitude modulation (PAMn), where n is an integer greater than or equal to 4.

According to some example embodiments of the inventive concept, there is provided a method of operating a memory device, the method including receiving a first read command corresponding to a first operating condition, outputting, in response to the first read command, a first data signal (hereinafter, a first DQ signal) and a first data strobe signal (hereinafter, a first DQS signal) based on n-level pulse amplitude modulation (PAMn) and associated with the first operating condition, receiving a second read command corresponding to a second operating condition that is different from the first operating condition, and outputting, in response to the second read command, a second DQ signal and a second DQS signal based on PAMn and associated with the second operating condition, wherein the first DQS signal has a different toggle pattern from that of the second DQS signal.

BRIEF DESCRIPTION OF THE DRAWINGS

Embodiments of the inventive concept will be more clearly understood from the following detailed description taken in conjunction with the accompanying drawings in which:

FIGS. 4 to 6 are block diagrams of a DQS generator configured to generate a DQS signal based on PAM4 and tables, according to example embodiments of the inventive concept;

DETAILED DESCRIPTION

Hereinafter, embodiments of the inventive concept will be described in detail with reference to the accompanying drawings.

Figure 1:
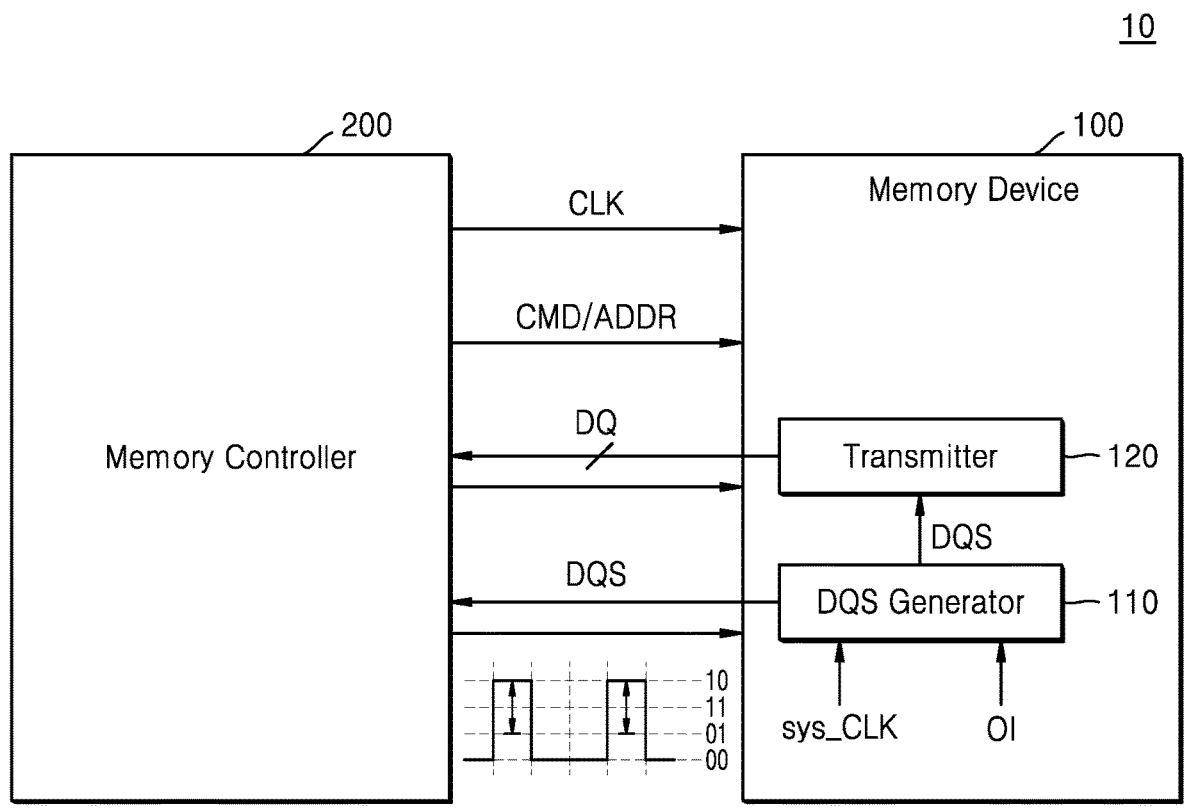
FIG. 1 is a block diagram of a memory system according to example embodiments of the inventive concept.

FIG. 1 is a block diagram of a memory system 10 according to example embodiments of the inventive concept. In the embodiments below, dynamic random access memory (DRAM) corresponding to a volatile memory is illustrated as a memory device 100 included in the memory system 10, but the embodiments of the inventive concept are not limited thereto. For example, a different type of volatile memory may be applied to the memory device 100, or a nonvolatile memory such as a resistive memory device or flash memory may be applied to a memory device according to example embodiments of the inventive concept.

Referring to FIG. 1, the memory system 10 may include the memory device 100 and a memory controller 200. The memory device 100 may include a DQS generator 110 and a transmitter 120.

The memory controller 200 may control a general memory operation of the memory device 100. The memory controller 200 may transmit control signals such as a clock signal CLK, a command CMD, an address ADDR, and a data strobe signal (hereinafter, referred to as a DQS signal) DQS and a data signal (hereinafter, referred to as a DQ signal) DQ to the memory device 100.

The memory device 100 may transmit the DQ signal DQ and the DQS signal DQS to the memory controller 200. The technical idea of the inventive concept to be described below may also be applied to the memory controller 200, and further applied to not only the memory system 10 but also various devices or systems using a DQS signal to sample a DQ signal.

The DQS generator 110, according to example embodiments of the inventive concept, may generate the DQS signal DQS based on operating information OI indicating an operating condition of the memory device 100 and on a system clock signal sys_CLK. For example, the operating information OI may include at least one of an operating frequency of the memory device 100, a power state, and/or a pattern of the DQ signal DQ. The operating frequency may be a frequency synchronized when the memory device 100 performs a memory operation. The power state indicates a power supply state to the memory device 100 and, for example, the power state may be determined based on a remaining capacity of a battery to which the memory device 100 is connected. According to some embodiments of the inventive concept, the pattern of the DQ signal DQ may correspond to a pattern based on n-level pulse amplitude modulation (PAMn) (n is an integer of 4 or more), and the DQ signal DQ may include various patterns according to data read-requested from the memory controller 200. The system clock signal sys_CLK may match the operating frequency of the memory device 100 and may be determined by the clock signal CLK received from the memory controller 200.

According to some example embodiments of the inventive concept, the DQS generator 110 may generate the DQS signal DQS including a toggle pattern matched or associated with the operating condition of the memory device 100, based on PAMn. Assuming that the DQS signal DQS is based on PAM4, the DQS signal DQS may include a toggle pattern including voltage levels respectively mapped to 2-bit data '00', '01', '10', and '11'. For example, the DQS signal DQS may include any one of a fixed toggle pattern and a random toggle pattern including four voltage levels. The fixed toggle pattern may correspond to a pattern toggled between a fixed toggle low level and a fixed toggle high level. The random toggle pattern may correspond to a pattern toggled among three or more voltage levels without the fixed toggle low level and the fixed toggle high level. According to example embodiments of the inventive concept, any one of the fixed toggle pattern and the random toggle pattern may be determined according to the operating condition of the memory device 100, and in the determined fixed toggle pattern or random toggle pattern, a detailed toggle pattern may be determined according to the operating condition of the memory device 100. A detailed description thereof will be made with reference to FIGS. 2A to 2C.

The transmitter 120 may receive the DQS signal DQS from the DQS generator 110, generate the DQ signal DQ including data read from a memory cell array (not shown) by being synchronized with the DQS signal DQS, and transmit the DQ signal DQ to the memory controller 200.

The memory device 100 according to example embodiments of the inventive concept, may output the DQS signal DQS, which is based on PAMn and has a toggle pattern matched or associated with the operating condition of the memory device 100, together with the DQ signal DQ, thereby improving the reliability of the DQ signal DQ at a reception side.

Figure 2A:
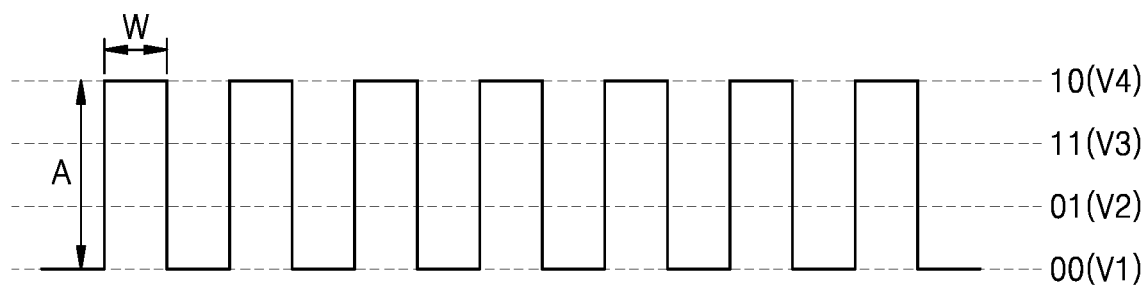
FIGS. 2A to 2C are signaling diagrams of DQS signals including various toggle patterns, according to example embodiments of the inventive concept.
Figure 2B:
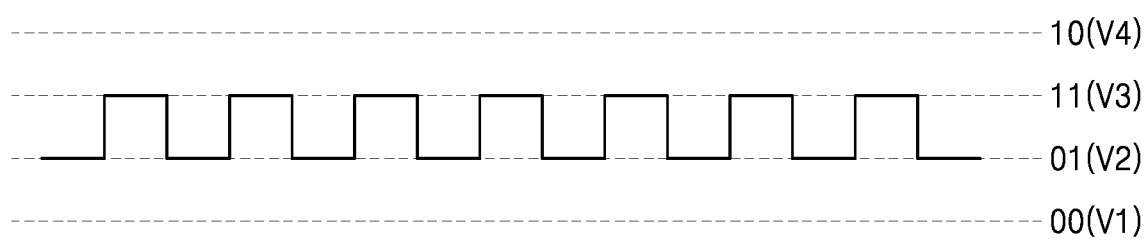
Figure 2C:
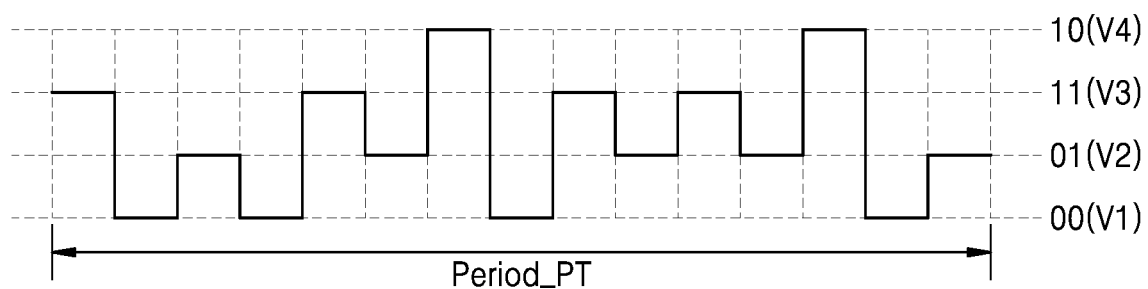

FIGS. 2A to 2C are signaling diagrams of DQS signals including various toggle patterns, according to example embodiments of the inventive concept. Although FIGS. 2A to 2C show DQS signals based on PAM4 having four levels, these are only example embodiments for convenience of understanding, the example embodiments are not limited thereto, and it would be sufficiently understood that the technical idea of the inventive concept is also applicable to a DQS signal based on PAMn and having eight or more levels.

Referring to FIG. 2A, a DQS signal may include a fixed first toggle pattern. First, a first level V1, the lowest level, of the DQS signal may be mapped to 2-bit data '00', and a fourth level V4, the highest level, of the DQS signal may be mapped to 2-bit data '10'. Intermediate levels, second and third levels V2 and V3, of the DQS signal may be mapped to 2-bit data '01' and '11', respectively. The aforementioned mapping between voltage levels, the first to fourth levels V1 to V4, and data is mapping according to a gray code and is merely an example embodiment, and thus, the mapping may be changed according to various purposes.

According to some example embodiments of the inventive concept, the DQS signal may include a toggle pattern having a toggle low level corresponding to the first level V1 and a toggle high level corresponding to the fourth level V4. At least one of an amplitude A and a width W of the toggle pattern may be changed to match an operating condition of a memory device. For example, a DQS generator may change the amplitude A by changing the toggle high level of the DQS signal from the fourth level V4 to either the second level V2 or the third level V3. For example, the DQS generator may generate the DQS signal of which the amplitude A is greater when an operating frequency condition of the memory device is high than when the operating frequency condition of the memory device is low. According to some embodiments, the DQS generator may generate the DQS signal when a power state of the memory device is good to have amplitude A that is greater than when the power state of the memory device is bad. As described above, the amplitude A of the DQS signal may be variously changed according to operating information of the memory device. According to some embodiments of the inventive concept, the width W may be changed to match an operating frequency of the memory device.

Referring to FIG. 2B, a DQS signal may include a fixed second toggle pattern. The DQS signal may include a toggle pattern having the toggle low level corresponding to the second level V2 and the toggle high level corresponding to the third level V3. According to example embodiments of the inventive concept, the toggle low level of the DQS signal may correspond to any one of the first to third levels V1 to V3, and the toggle high level of the DQS signal may correspond to any one of the second to fourth levels V2 to V4.

As shown in FIG. 2B, by assigning a certain level instead of the lowest level V1 to the toggle low level of the DQS signal, the DQS signal that may be further suitable for a dynamic toggle pattern change according to an operating condition of a memory device may be generated.

Referring to FIG. 2C, a DQS signal may include a random toggle pattern. The DQS signal may include a toggle pattern having the first to fourth levels V1 to V4 and may be formed to transition from a higher level to a lower level and transition from a lower level to a higher level. The random toggle pattern of the DQS signal may be determined in every certain pattern period Period_PT. The certain pattern period Period_PT may correspond to a data unit group of a DQ signal. That is, the DQ signal may include a plurality of data patterns, each being matched or associated with the data unit group, and the DQS signal may include a plurality of toggle patterns which respectively correspond to the plurality of data patterns and are different from each other. The DQS generator may generate the DQS signal having the random toggle pattern, based on an operating condition of a memory device and a pattern of the DQ signal.

Figure 3:
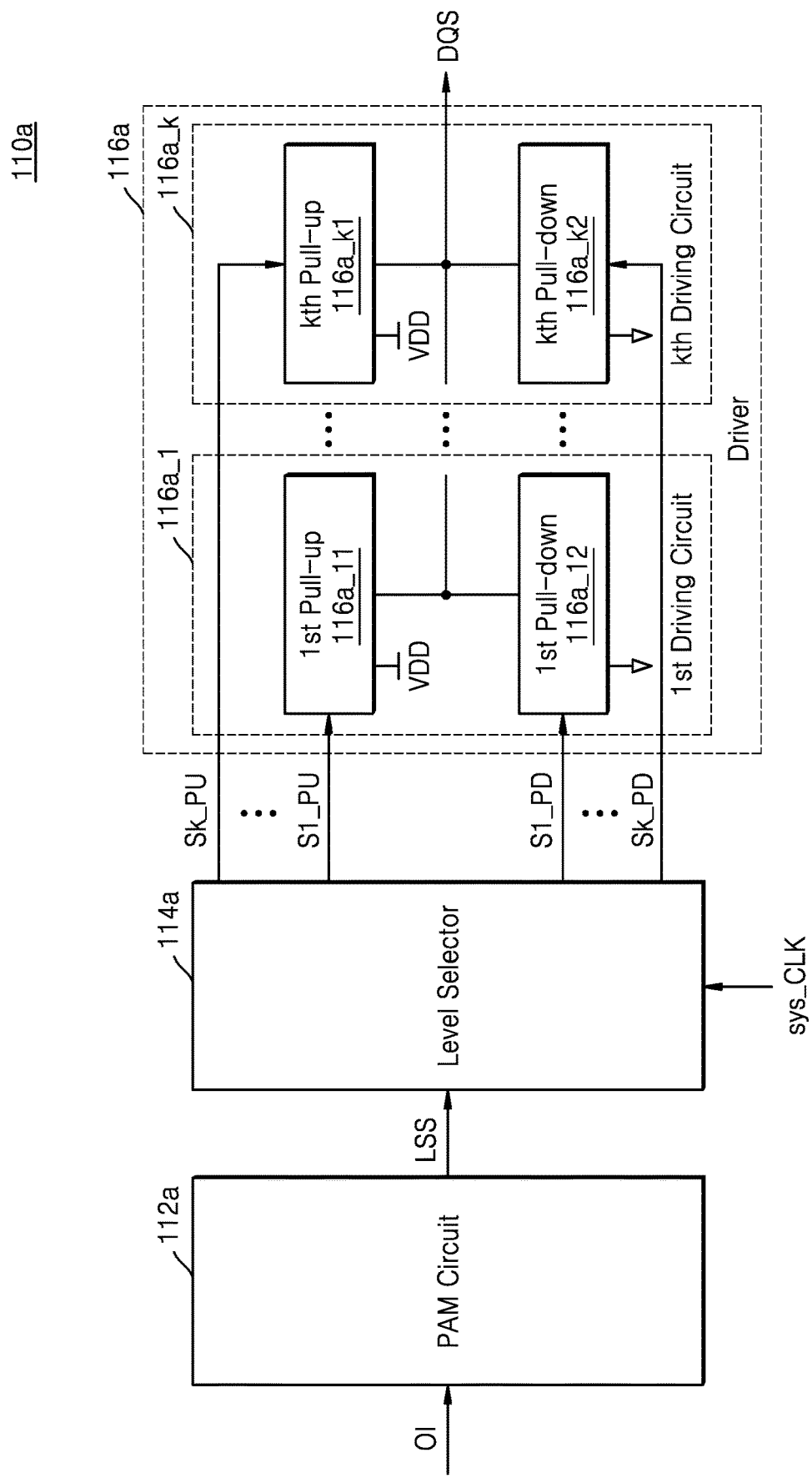
FIG. 3 is a block diagram of a DQS generator according to example embodiments of the inventive concept.

FIG. 3 is a block diagram of a DQS generator 110a according to example embodiments of the inventive concept.

Referring to FIG. 3, the DQS generator 110a may include a PAM circuit 112a, a level selector 114a, and a driver 116a.

The PAM circuit 112a may receive the operating information OI of a memory device and determine a toggle pattern of the DQS signal DQS based on the operating information OI. The PAM circuit 112a may determine the toggle pattern by considering the number of voltage levels based on a preset number of PAM levels. The PAM circuit 112a may generate a level selection signal LSS based on the determined toggle pattern and provide the level selection signal LSS to the level selector 114a.

The level selector 114a may receive the level selection signal LSS and the system clock signal sys_CLK, generate pull-up bit signals S1_PU to Sk_PU and pull-down bit signals S1_PD to Sk_PD based on the level selection signal LSS by being synchronized with the system clock signal sys_CLK, and provide the pull-up bit signals S1_PU to Sk_PU and the pull-down bit signals S1_PD to Sk_PD to the driver 116a.

The driver 116a may include first to kth driving circuits 116a_1 to 116a_k (k is an integer of 2 or more). According to some embodiments of the inventive concept, the number of driving circuits in the driver 116a may vary according to the number of PAM levels, or the driver 116a may include a fixed number of driving circuits of which the number of activated driving circuits varies according to the number of PAM levels. An example embodiment of a DQS generator 110b based on PAM4 will be described below with reference to FIG. 4.

The first driving circuit 116a_1 may include a first pull-up circuit 116a_11 to which a power supply voltage VDD is directly provided and a first pull-down circuit 116a_12 grounded, and the kth driving circuit 116a_k may include a kth pull-up circuit 116a_k1 to which the power supply voltage VDD is directly provided and a kth pull-down circuit 116a_k2 grounded. The DQS signal DQS may be output from a first node to which the first pull-up circuit 116a_11 and the first pull-down circuit 116a_12 are connected and/or a kth node to which the kth pull-up circuit 116a_k1 and the kth pull-down circuit 116a_k2 are connected.

The first pull-up circuit 116a_11 may selectively connect the power supply voltage VDD to the first node in response to a first pull-up bit signal S1_PU. The first pull-down circuit 116a_12 may selectively ground the first node in response to a first pull-down bit signal S1_PD. In addition, the kth pull-up circuit 116a_k1 may selectively connect the power supply voltage VDD to the kth node in response to a kth pull-up bit signal Sk_PU. The kth pull-down circuit 116a_k2 may selectively ground the kth node in response to a kth pull-down bit signal Sk_PD.

Each of the first to kth pull-up circuits 116a_11 to 116a_k1 and the first to kth pull-down circuits 116a_12 to 116a_k2 may include a plurality of transistors having a gate terminal through which a bit signal is received.

Figure 4:
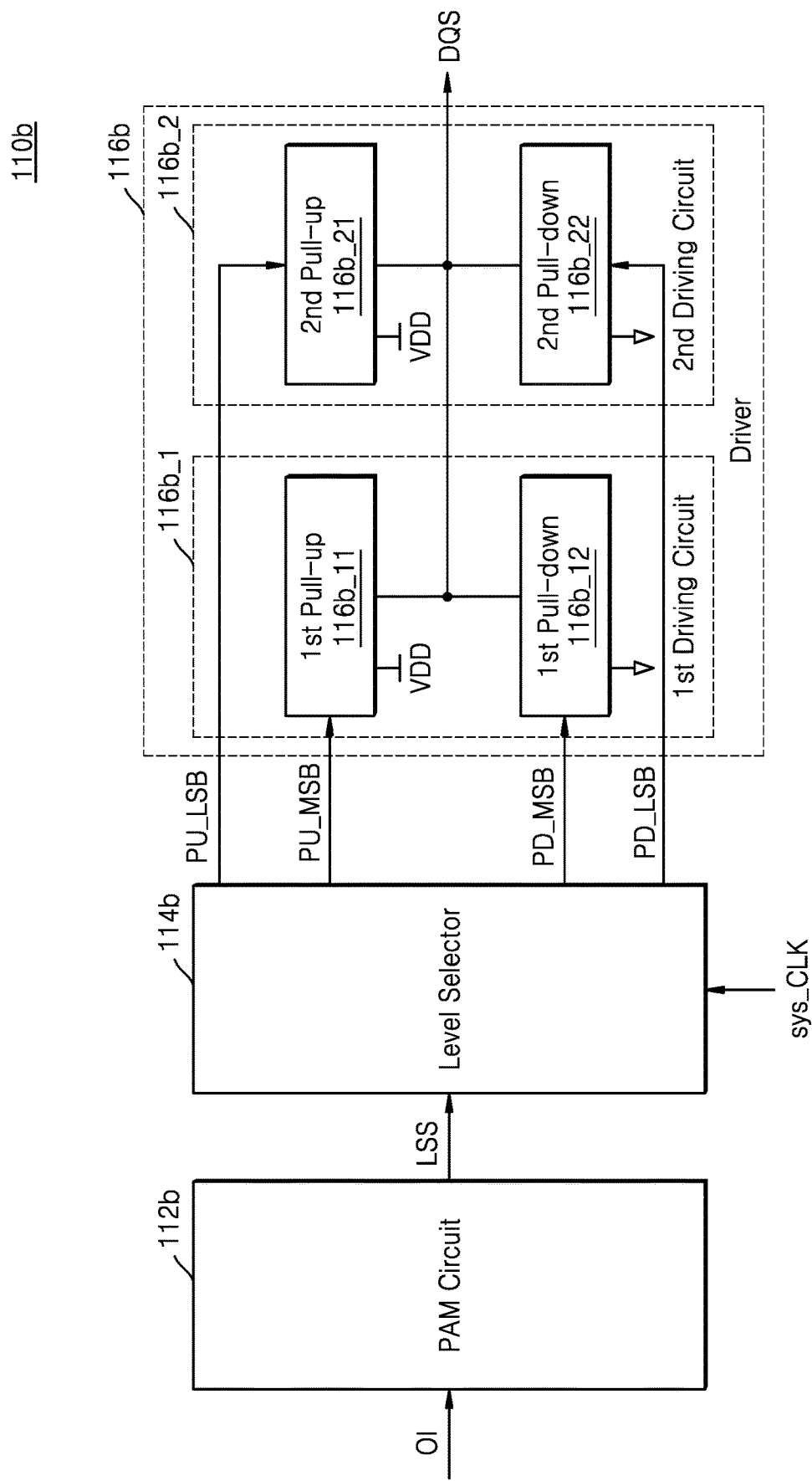

FIGS. 4 to 6 are block diagrams of the DQS generator 110b configured to generate a DQS signal based on PAM4 and tables, according to example embodiments of the inventive concept.

Referring to FIG. 4, the DQS generator 110b may include a PAM circuit 112b, a level selector 114b, and a driver 116b. Hereinafter, the description made with reference to FIG. 3 is not repeated. The driver 116b may include first and second driving circuits 116b_1 and 116b_2. The first driving circuit 116b_1 may include a first pull-up circuit 116b_11 configured to receive a pull-up most significant bit (MSB) signal PU_MSB and a first pull-down circuit 116b_12 configured to receive a pull-down MSB signal PD_MSB. The second driving circuit 116b_2 may include a second pull-up circuit 116b_21 configured to receive a pull-up least significant bit (LSB) signal PU_LSB and a second pull-down circuit 116b_22 configured to receive a pull-down LSB signal PD_LSB. The pull-up and pull-down MSB signals PU_MSB and PD_MSB and the pull-up and pull-down LSB signals PU_LSB and PD_LSB may correspond to the 2-bit data described with reference to FIGS. 2A to 2C. Hereinafter, for convenience of understanding, a description will be made with reference to FIGS. 2A to 2C together.

FIGS. 5 and 6 respectively show a first table TB1 including values of the level selection signal LSS generated by the PAM circuit 112b to control level transitioning of the DQS signal DQS and a second table TB2 including values of the pull-up and pull-down MSB signals PU_MSB and PD_MSB and the pull-up and pull-down LSB signals PU_LSB and PD_LSB generated by the level selector 114b based on the level selection signal LSS.

Referring to the first and second tables TB1 and TB2, the PAM circuit 112b may generate the level selection signal LSS having a value of '1' so that the DQS signal DQS transitions from the first level V1 to the second level V2, and the level selector 114b may generate the pull-up and pull-down MSB signals PU_MSB and PD_MSB respectively having values of '0' and '1' and the pull-up and pull-down LSB signals PU_LSB and PD_LSB respectively having values of '1' and '0', based on the level selection signal LSS. The PAM circuit 112b may generate the level selection signal LSS having a value of '2' so that the DQS signal DQS transitions from the first level V1 to the third level V3, and the level selector 114b may generate the pull-up and pull-down MSB signals PU_MSB and PD_MSB respectively having values of '1' and '0' and the pull-up and pull-down LSB signals PU_LSB and PD_LSB respectively having values of '0' and '1', based on the level selection signal LSS. The PAM circuit 112b may generate the level selection signal LSS having a value of '3' so that the DQS signal DQS transitions from the first level V1 to the fourth level V4, and the level selector 114b may generate the pull-up and pull-down MSB signals PU_MSB and PD_MSB respectively having values of '1' and '0' and the pull-up and pull-down LSB signals PU_LSB and PD_LSB respectively having values of '1' and '0', based on the level selection signal LSS.

The PAM circuit 112b may generate the level selection signal LSS having a value of '4' so that the DQS signal DQS transitions from the second level V2 to the first level V1, and the level selector 114b may generate the pull-up and pull-down MSB signals PU_MSB and PD_MSB respectively having values of '0' and '1' and the pull-up and pull-down LSB signals PU_LSB and PD_LSB respectively having values of '0' and '1', based on the level selection signal LSS. The PAM circuit 112b may generate the level selection signal LSS having a value of '5' so that the DQS signal DQS transitions from the second level V2 to the third level V3, and the level selector 114b may generate the pull-up and pull-down MSB signals PU_MSB and PD_MSB respectively having values of '1' and '0' and the pull-up and pull-down LSB signals PU_LSB and PD_LSB respectively having values of '0' and '1', based on the level selection signal LSS. The PAM circuit 112b may generate the level selection signal LSS having a value of '6' so that the DQS signal DQS transitions from the second level V2 to the fourth level V4, and the level selector 114b may generate the pull-up and pull-down MSB signals PU_MSB and PD_MSB respectively having values of '1' and '0' and the pull-up and pull-down LSB signals PU_LSB and PD_LSB respectively having values of '1' and '0', based on the level selection signal LSS.

In the same manner as described above, the PAM circuit 112b may generate the level selection signal LSS having a value of any one of '7' to '12' to control level transitioning of the DQS signal DQS, and the level selector 114b may generate the pull-up and pull-down MSB signals PU_MSB and PD_MSB and the pull-up and pull-down LSB signals PU_LSB and PD_LSB based on the level selection signal LSS, as shown in FIG. 5 and FIG. 6.

However, FIGS. 5 and 6 are only an example embodiment, and thus, the example embodiments are not limited thereto, and embodiments of various control modes for changing a toggle pattern of a DQS signal based on PAMn may be applied to the DQS generator 110b of FIG. 4.

Figure 7:
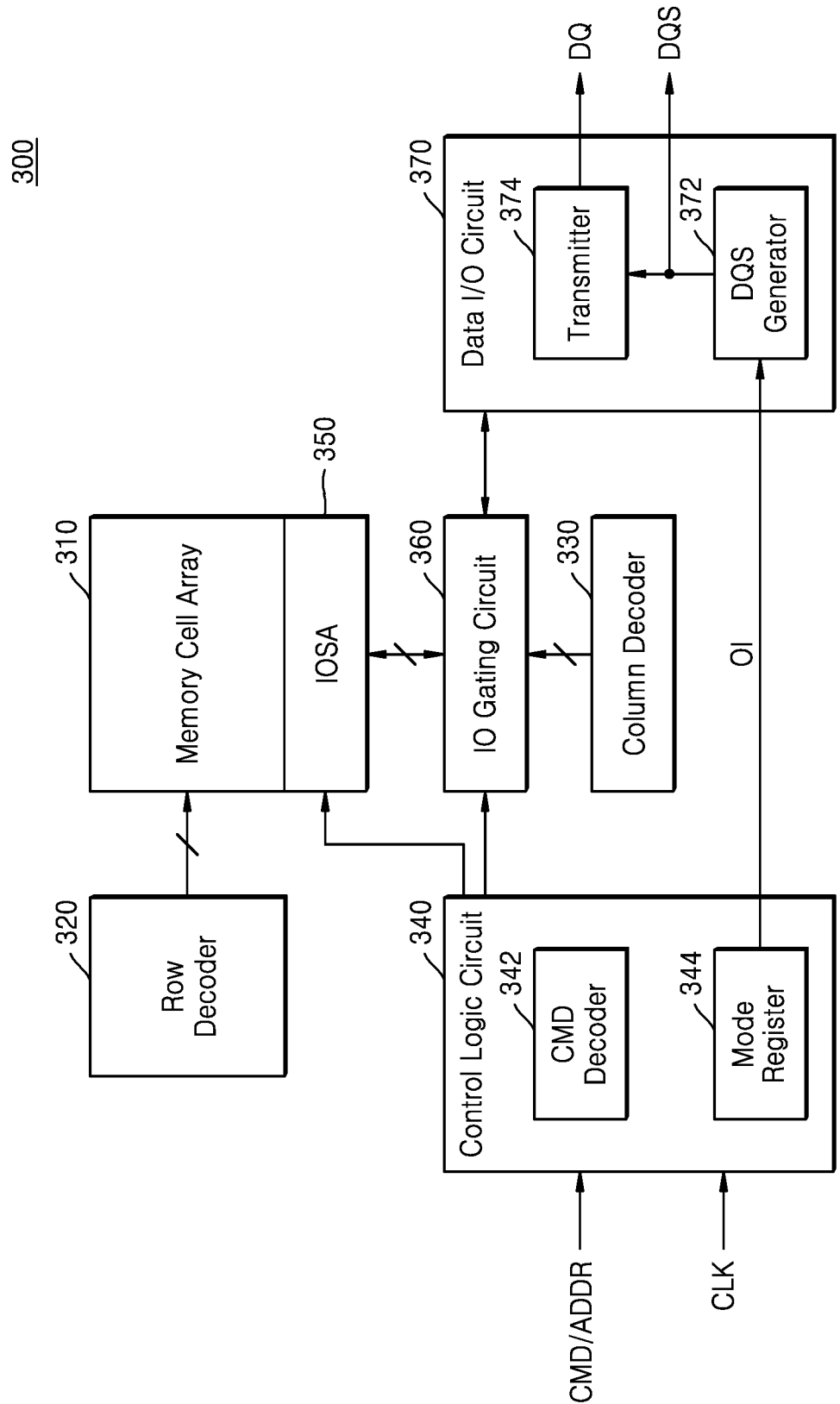
FIG. 7 is a block diagram of a memory device according to example embodiments of the inventive concept.

FIG. 7 is a block diagram of a memory device 300 according to example embodiments of the inventive concept.

Referring to FIG. 7, the memory device 300 may include a memory cell array 310, a row decoder 320, a column decoder 330, a control logic circuit 340, an input and output sense amplifier 350, an input and output gating circuit 360, and a data input and output circuit 370.

The memory cell array 310 may include memory cells connected to a plurality of word lines and a plurality of bit lines, and the row decoder 320 may perform a select operation on word lines in response to a row address from external to the memory cell array 310. In addition, the column decoder 330 may perform a select operation on bit lines in response to a column address from the outside.

The control logic circuit 340 may control a general operation of the memory device 300. For example, the control logic circuit 340 may control various kinds of circuit blocks in the memory device 300 in response to a command from a memory controller.

The control logic circuit 340 may sequentially receive the command CMD and the address ADDR through command/address (CA) pads (or pins). The control logic circuit 340 may include a command decoder 342 and a mode register 344. The command decoder 342 may generate an internal command for controlling a memory operation by decoding the received command CMD and provide the internal command to the input and output sense amplifier 350, the input and output gating circuit 360, and the like. The mode register 344 may set an operating mode of the memory device 300 based on the command CMD and the address ADDR. According to some embodiments of the inventive concept, the command CMD and the address ADDR may include a mode register set (MRS) signal.

The data input and output circuit 370, according to example embodiments of the inventive concept, may include a DQS generator 372 and a transmitter 374. The mode register 344 may generate the operating information OI indicating an operating condition of the memory device 300 and provide the operating information OI to the DQS generator 372. The operating information OI may include an operating frequency, a power state, and/or a pattern of the DQ signal DQ of the memory device 300. The DQS generator 372 may generate the DQS signal DQS including a toggle pattern matched or associated with the operating condition of the memory device 300, based on the operating information M. The transmitter 374 may receive the DQS signal DQS from the DQS generator 372 and output the DQ signal DQ including data read from the memory cell array 310. The DQ signal DQ may be synchronized with the DQS signal DQS.

Figure 8:
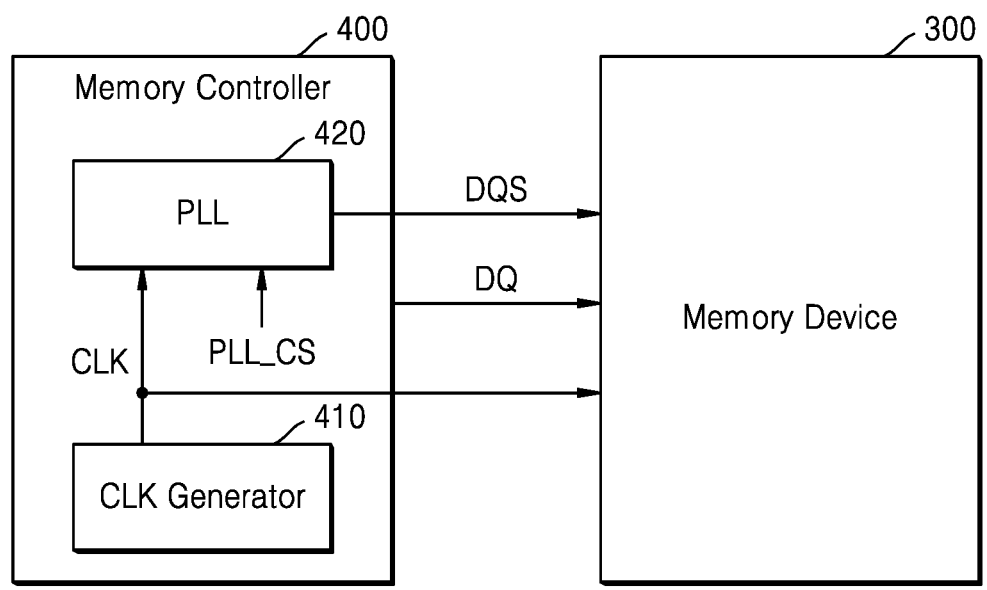
FIG. 8 is a block diagram of a memory system according to example embodiments of the inventive concept.

FIG. 8 is a block diagram of a memory system 20 according to example embodiments of the inventive concept.

Referring to FIG. 8, the memory system 20 may include the memory device 300 and a memory controller 400. The memory controller 400 may be configured to generate the DQS signal DQS to which example embodiments of the inventive concept is applied. The memory controller 400 may include a clock generator 410 and a phase locked loop (PLL) circuit 420. The clock generator 410, according to example embodiments of the inventive concept, may generate, based on PAMn, the clock signal CLK including a toggle pattern matched or associated with an operating condition of the memory controller 400 or the memory system 20 and provide the clock signal CLK to the PLL circuit 420. The PLL circuit 420 may generate the DQS signal DQS by adjusting a phase or frequency of the clock signal CLK based on a PLL control signal PLL CS. The DQS signal DQS may include the toggle patterns described with reference to FIGS. 2A to 2C and may be output to the memory device 300 together with the DQ signal DQ.

However, the configuration of the memory controller 400 in FIG. 8 is merely an example embodiment, and thus, the memory controller 400 is not limited thereto, and various implementing examples for generating the DQS signal to which the technical idea of the inventive concept is applied are applicable.

Figure 9A:
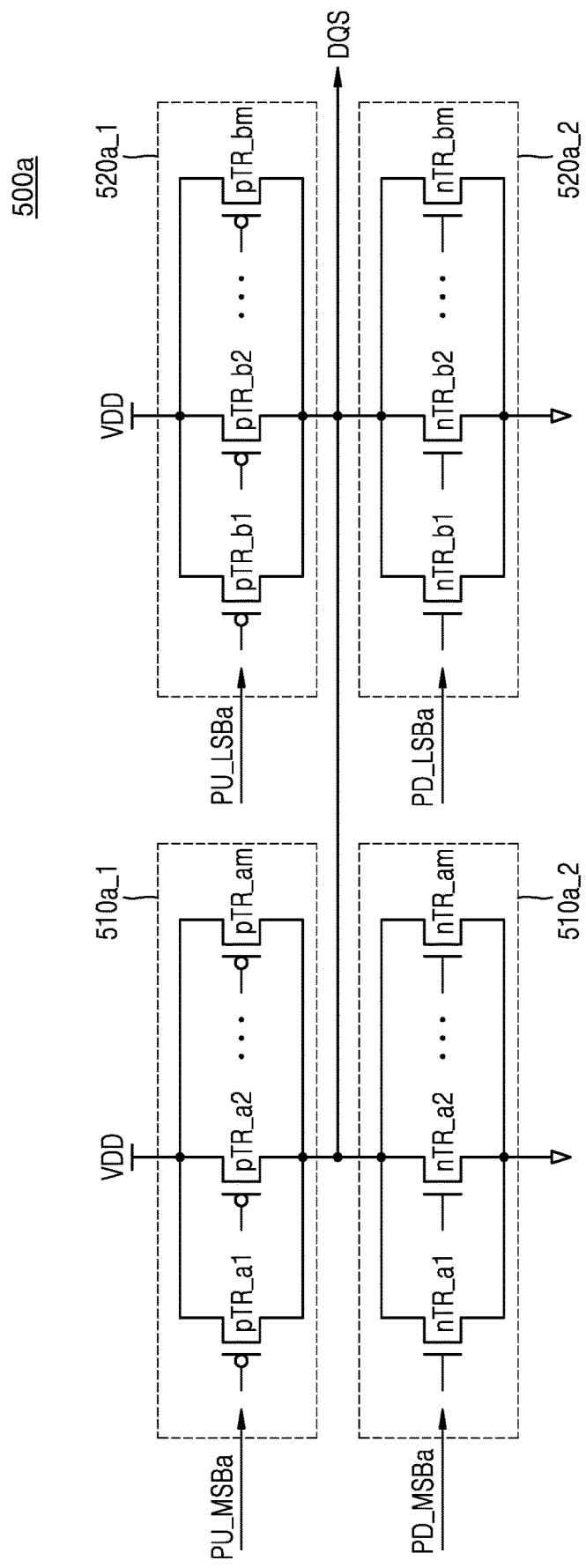
FIGS. 9A and 9B are circuit diagrams of a driver of FIG. 4, according to example embodiments of the inventive concept.
Figure 9B:
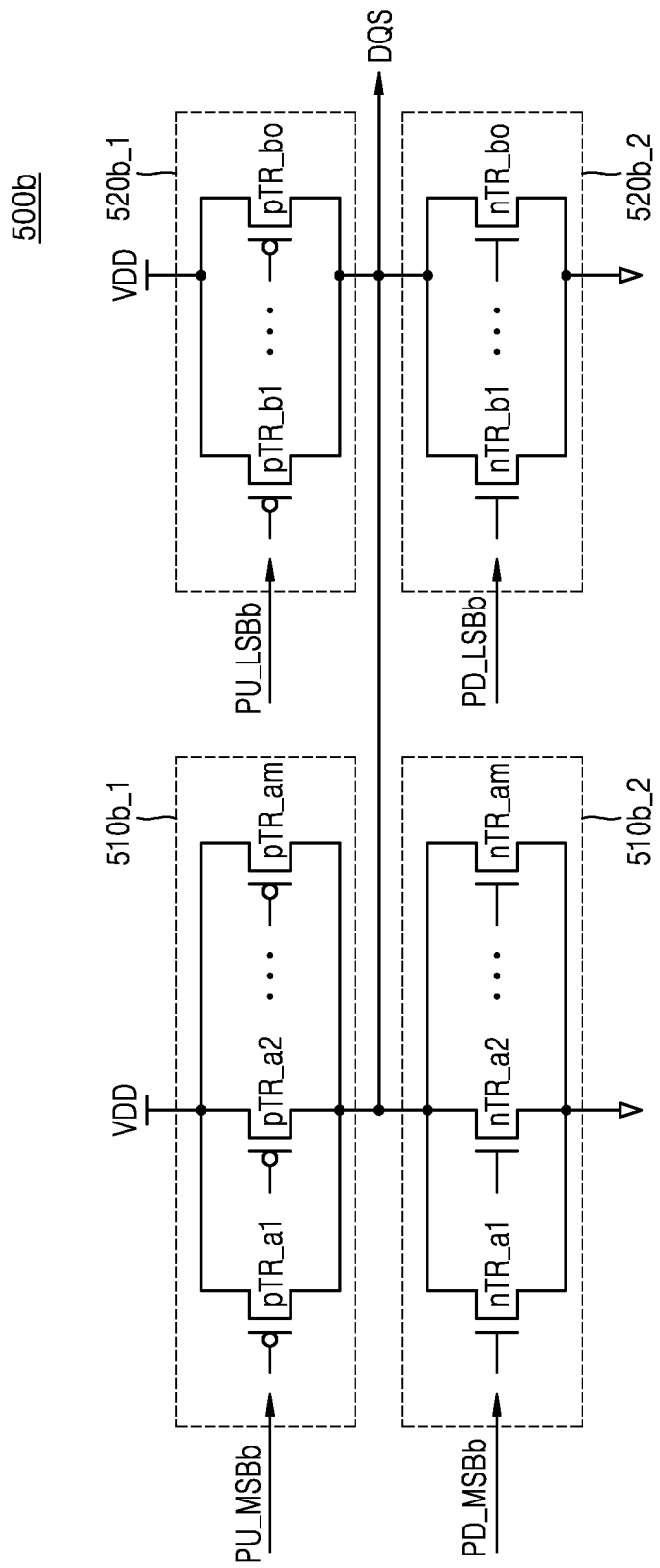

FIGS. 9A and 9B are circuit diagrams of the driver 116b of FIG. 4, according to example embodiments of the inventive concept.

Referring to FIG. 9A, a driver 500a may include first and second pull-up circuits 510a_1 and 520a_1 and first and second pull-down circuits 510a_2 and 520a_2. The first pull-up circuit 510a_1 may include first to mth p-channel metal oxide semiconductor (pMOS) transistors pTR_a1~_pTR_am (m is an integer of 3 or more), and the first pull-down circuit 510a_2 may include first to mth n-channel metal oxide semiconductor (nMOS) transistors nTR_a1~nTR_am. The second pull-up circuit 520a_1 may include (m+1)th to 2mth pMOS transistors pTR_b1~pTR_bm, and the second pull-down circuit 520a_2 may include (m+1)th to 2mth nMOS transistors nTR_b1~nTR_bm.

According to example embodiments of the inventive concept, the first to mth pMOS transistors pTR_a1~pTR_am in the first pull-up circuit 510a_1 may receive a pull-up MSB signal PU_MSBa through gate terminals thereof, and the first to mth nMOS transistors nTR_a1~nTR_am in the first pull-down circuit 510a_2 may receive a pull-down MSB signal PD_MSBa through gate terminals thereof. The (m+1)th to 2mth pMOS transistors pTR_b1~pTR_bm in the second pull-up circuit 520a_1 may receive a pull-up LSB signal PU_LSBa through gate terminals thereof, and the (m+1)th to 2mth nMOS transistors nTR_b1~nTR_bm in the second pull-down circuit 520a_2 may receive a pull-down LSB signal PD_LSBa through gate terminals thereof.

According to example embodiments of the inventive concept, the first to mth pMOS transistors pTR_a1~pTR_am in the first pull-up circuit 510a_1 and the first to mth nMOS transistors nTR_a1~nTR_am in the first pull-down circuit 510a_2 may have a characteristic that more current flows therethrough under the same condition than the (m+1)th to 2mth pMOS transistors pTR_b1~pTR_bm in the second pull-up circuit 520a_1 and the (m+1)th to 2mth nMOS transistors nTR_b1~nTR_bm in the second pull-down circuit 520a_2. For example, the first to mth pMOS transistors pTR_a1~pTR_am in the first pull-up circuit 510a_1 and the first to mth nMOS transistors nTR_a1~nTR_am in the first pull-down circuit 510a_2 may have a larger channel width or size than the (m+1)th to 2mth pMOS transistors pTR_b1~pTR_bm in the second pull-up circuit 520a_1 and the (m+1)th to 2mth nMOS transistors nTR_b1~nTR_bm in the second pull-down circuit 520a_2, respectively.

Referring to FIG. 9B together, compared to FIG. 9A, a second pull-up circuit 520b_1 may include (m+1)th to (m+o)th pMOS transistors pTR_b1 to pTR_bo (o is an integer of 2 or more), and a second pull-down circuit 520b_2 may include (m+1)th to (m+o)th nMOS transistors nTR_b1 to nTR_bo. That is, the number of transistors in the second pull-up circuit 520b_1 may be different from the number of transistors in a first pull-up circuit 510b_1, and the number of transistors in the second pull-down circuit 520b_2 may be different from the number of transistors in a first pull-down circuit 510b_2. Particularly, the number of transistors in the second pull-up circuit 520b_1 may be less than the number of transistors in the first pull-up circuit 510b_1, and the number of transistors in the second pull-down circuit 520b_2 may be less than the number of transistors in the first pull-down circuit 510b_2.

In this case, the first to mth pMOS transistors pTR_a1~pTR_am in the first pull-up circuit 510b_1 and the first to mth nMOS transistors nTR_a1~nTR_am in the first pull-down circuit 510b_2 may have the same or similar characteristic as or to the (m+1)th to (m+o)th pMOS transistors pTR_b1 to pTR_bo in the second pull-up circuit 520b_1 and the (m+1)th to (m+o)th nMOS transistors nTR_b1 to nTR_bo in the second pull-down circuit 520b_2.

However, the embodiments of the driver 500a and a driver 500b shown in FIGS. 9A and 9B are merely illustrative, and thus, the drivers 500a and 500b are not limited thereto, and a driver may be implemented by the same or similar type of transistors or other types of transistors.

Figure 10:
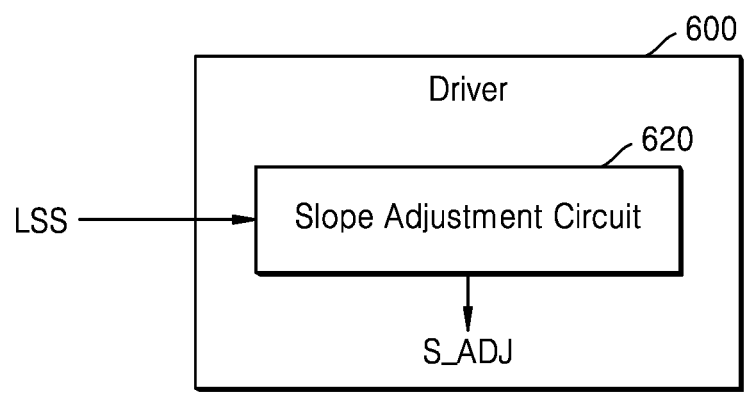
FIG. 10 is a block diagram of a driver configured to adjust a level transition slope of a DQS signal, according to example embodiments of the inventive concept.
Figure 11A:
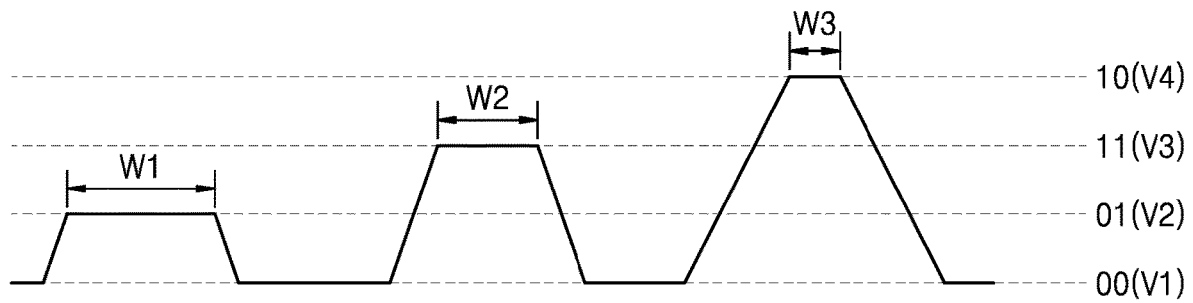
FIGS. 11A and 11B are signaling diagrams for describing an operation of the driver of FIG. 10.
Figure 11B:
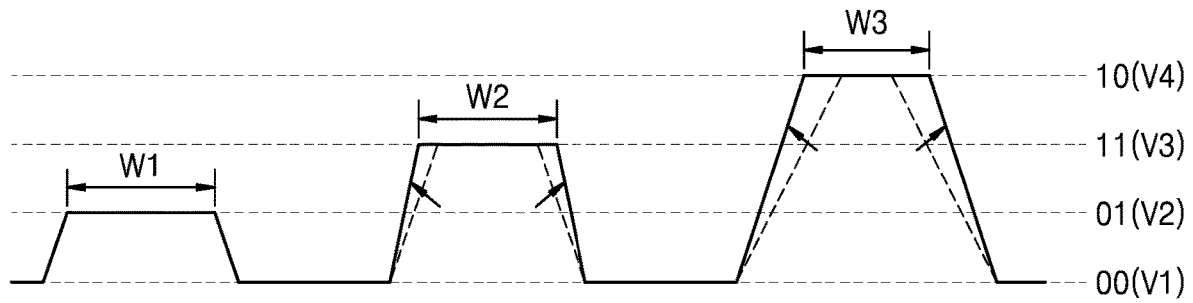

FIG. 10 is a block diagram of a driver 600 configured to adjust a level transition slope of a DQS signal, according to example embodiments of the inventive concept, and FIGS. 11A and 11B are signaling diagrams for describing an operation of the driver 600 of FIG. 10.

Referring to FIG. 10, the driver 600 may include a slope adjustment circuit 620. The slope adjustment circuit 620 may adjust a level transition slope of a DQS signal based on a toggle level interval of a toggle pattern of the DQS signal.

Referring to FIG. 11A together, assuming that the level transition slope is constant when the toggle level interval of the DQS signal is changed according to an operating condition of a memory device, a width (or a margin) of a high or low level of the DQS signal may vary due to a time taken for level transitioning. Particularly, a first width W1 in the toggle level interval from the first level V1 to the second level V2, a second width W2 in the toggle level interval from the first level V1 to the third level V3, and a third width W3 in the toggle level interval from the first level V1 to the fourth level V4 may be different from each other. When at least one of the second and third widths W2 and W3 is less than a minimum width for guaranteeing data reliability, the performance of a memory device including the driver 600 may be deteriorated. Accordingly, the slope adjustment circuit 620 may adjust the level transition slope as shown in FIG. 11B, so that second and third widths W2 and W3 are sufficient for proper performance.

Referring to FIG. 11B together, the slope adjustment circuit 620 may adjust the level transition slope so that the DQS signal has the second width W2, which is the same as or similar to the first width W1 when the toggle level interval of the DQS signal is between the first level V1 and the third level V3, and adjust the level transition slope so that the DQS signal has the third width W3, which is the same as or similar to the first width W1 when the toggle level interval of the DQS signal is between the first level V1 and the fourth level V4. By doing this, in data communication using a DQS signal according to example embodiments of the inventive concept, improved data reliability may be persistently guaranteed even when a toggle pattern of the DQS signal is changed.

Referring back to FIG. 10, according to example embodiments of the inventive concept, the slope adjustment circuit 620 may generate an adjustment signal S_ADJ for adjusting the level transition slope of the DQS signal, based on the level selection signal LSS generated by the PAM circuit 112a of FIG. 3. The driver 600 may add the adjustment signal S_ADJ to the DQS signal and output the resulting addition signal.

It would be sufficiently understood that the slope adjustment operation described above may be applied to all DQS signals having various toggle patterns as described with reference to FIGS. 2A to 2C.

Figure 12:
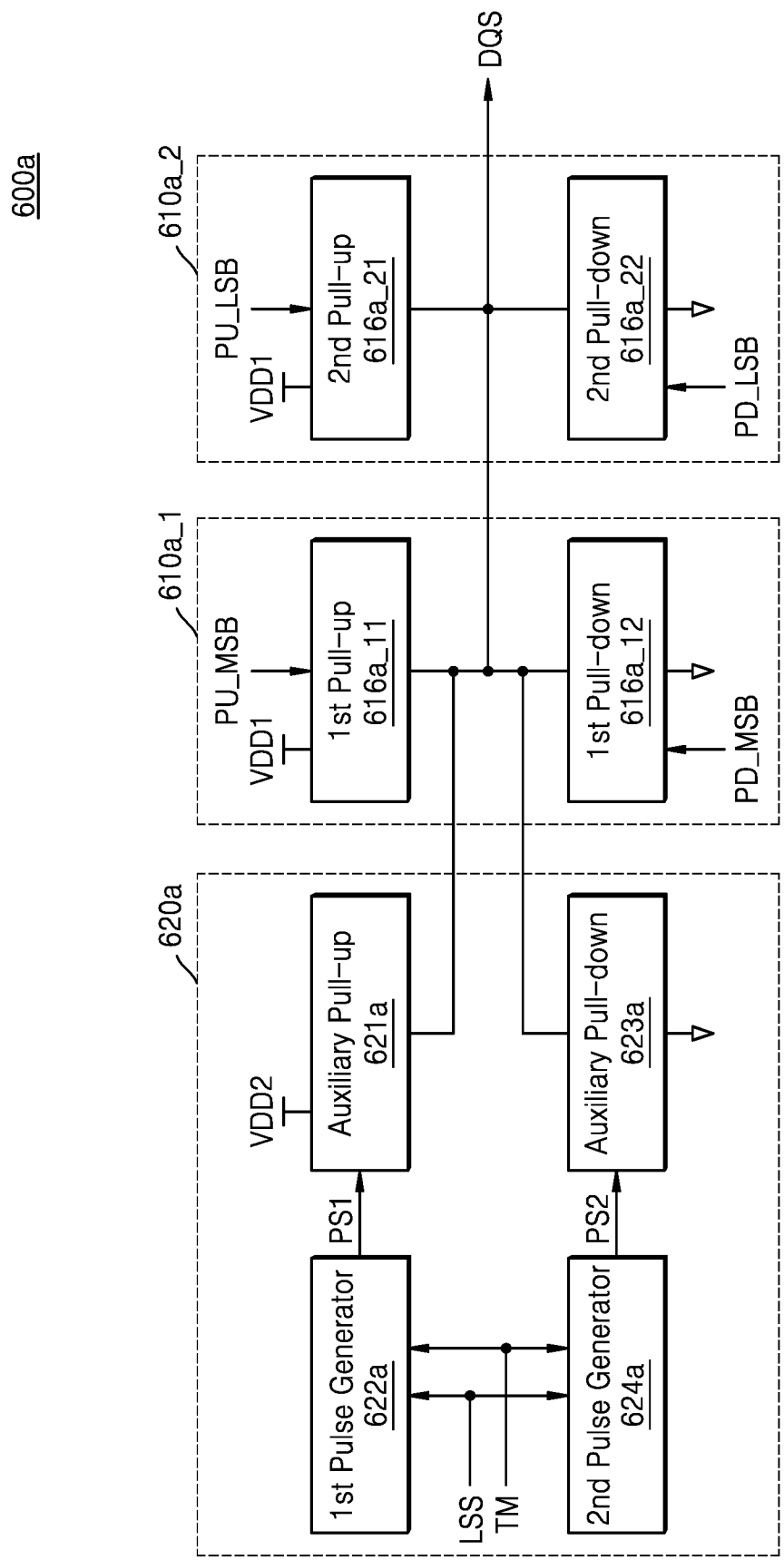
FIG. 12 is a block diagram of a driver according to example embodiments of the inventive concept.
Figure 13:
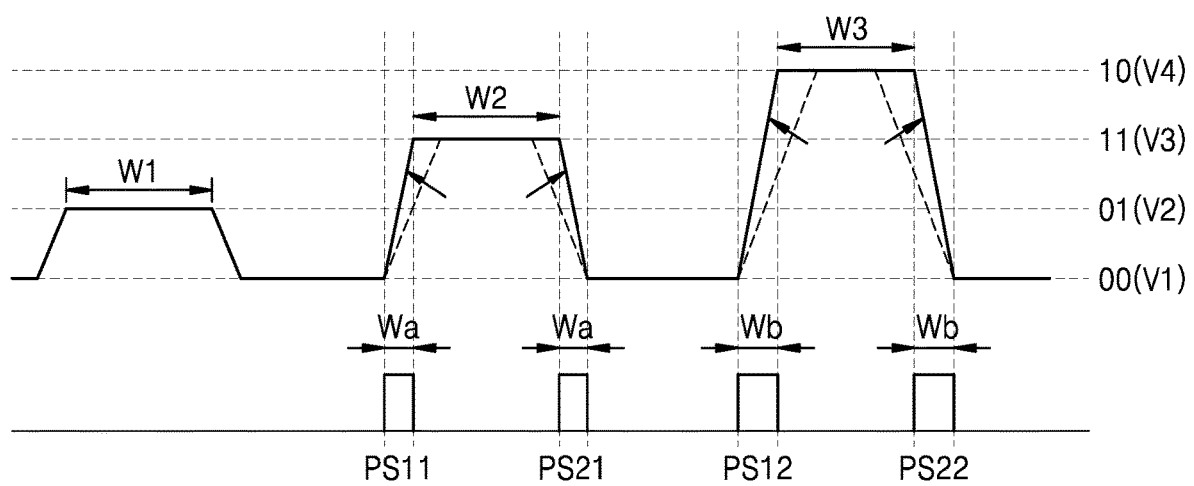
FIG. 13 is a signaling diagram for describing a particular operation of the driver of FIG. 12.

FIG. 12 is a block diagram of a driver 600a according to example embodiments of the inventive concept, and FIG. 13 is a signaling diagram for describing a particular operation of the driver 600a of FIG. 12.

Referring to FIG. 12, the driver 600a may include a slope adjustment circuit 620a and first and second driving circuits

610a_1 and 610a_2. The slope adjustment circuit 620a may include first and second pulse generators 622a and 624a, an auxiliary pull-up circuit 621a, and an auxiliary pull-down circuit 623a. According to some embodiments of the inventive concept, the first and second pulse generators 622a and 624a may be implemented by one pulse generator, and the auxiliary pull-up circuit 621a and the auxiliary pull-down circuit 623a may be implemented by one auxiliary circuit.

According to example embodiments of the inventive concept, the auxiliary pull-up circuit 621a may receive a second power supply voltage VDD2 that is the same as or different from a first power supply voltage VDD1 provided to first and second pull-up circuits 616a_11 and 616a_21. For example, a level transition slope of the DQS signal DQS may be quickly adjusted with the second power supply voltage VDD2 that is higher than the first power supply voltage VDD1, or the power efficiency of an adjusting operation may be improved with the second power supply voltage VDD2 that is lower than the first power supply voltage VDD1. The auxiliary pull-down circuit 623a may be grounded. The auxiliary pull-up circuit 621a and the auxiliary pull-down circuit 623a may be connected to a node from which the DQS signal DQS is output.

According to example embodiments of the inventive concept, the first pulse generator 622a may generate a first pulse signal PS1 based on the level selection signal LSS generated by the PAM circuit 112a of FIG. 3 and a timing signal TM and provide the first pulse signal PS1 to the auxiliary pull-up circuit 621a. The auxiliary pull-up circuit 621a may adjust the level transition slope of the DQS signal DQS when transitioning from the low level to the high level, in response to the first pulse signal PS1.

According to example embodiments of the inventive concept, the second pulse generator 624a may generate a second pulse signal PS2 based on the level selection signal LSS generated by the PAM circuit 112a of FIG. 3 and the timing signal TM and provide the second pulse signal PS2 to the auxiliary pull-down circuit 623a. The auxiliary pull-down circuit 623a may adjust the level transition slope of the DQS signal DQS when transitioning from the high level to the low level, in response to the second pulse signal PS2. The timing signal TM is a signal indicating a transition timing of the DQS signal DQS, and the first and second pulse generators 622a and 624a may respectively generate the first and second pulse signals PS1 and PS2 when the DQS signal DQS transitions.

The first and second driving circuits 610a_1 and 610a_2 have been described in detail with reference to FIG. 4, and thus a duplicated description thereof is not repeated herein.

Referring to FIG. 13 together, the first pulse generator 622a may generate a first pulse signal PS11 having a first pulse width Wa during a period matched or associated with a timing when the DQS signal transitions from the first level V1 to the third level V3. In addition, the first pulse generator 622a may generate a first pulse signal PS12 having a second pulse width Wb during a period matched or associated with a timing when the DQS signal transitions from the first level V1 to the fourth level V4.

The second pulse generator 624a may generate a second pulse signal PS21 having the first pulse width Wa during a period matched or associated with a timing when the DQS signal transitions from the third level V3 to the first level V1. In addition, the second pulse generator 624a may generate a second pulse signal PS22 having the second pulse width Wb during a period matched or associated with a timing when the DQS signal transitions from the fourth level V4 to the first level V1.

According to example embodiments of the inventive concept, the second pulse width Wb may be greater than the first pulse width Wa, and the first and second pulse widths Wa and Wb may be variously changed according to a magnitude of a toggle level interval of a DQS signal. Furthermore, although the rising and falling edges of the first pulse signal PS11 and second pulse signal PS21 are illustrated in FIG. 13 as both having a first pulse width Wa, in some embodiments, the first pulse signal PS11 associated with the rising edge may have a different pulse width from the second pulse signal PS21 associated with the falling edge.

According to some embodiments of the inventive concept, the first and second pulse generators 622a and 624a may obtain the effect shown in FIG. 13 by differently adjusting pulse magnitudes (or heights) of the first and second pulse signals PS11, PS12, PS21, and PS22.

The embodiments related to FIG. 13 are only illustrative, and thus, the present disclosure is not limited thereto, and it would be sufficiently understood that the slope adjustment embodiment may also be applied to the toggle patterns as shown in FIGS. 2B and 2C and also be applied when a DQS signal is based on PAM having a higher level than 4.

Figure 14:
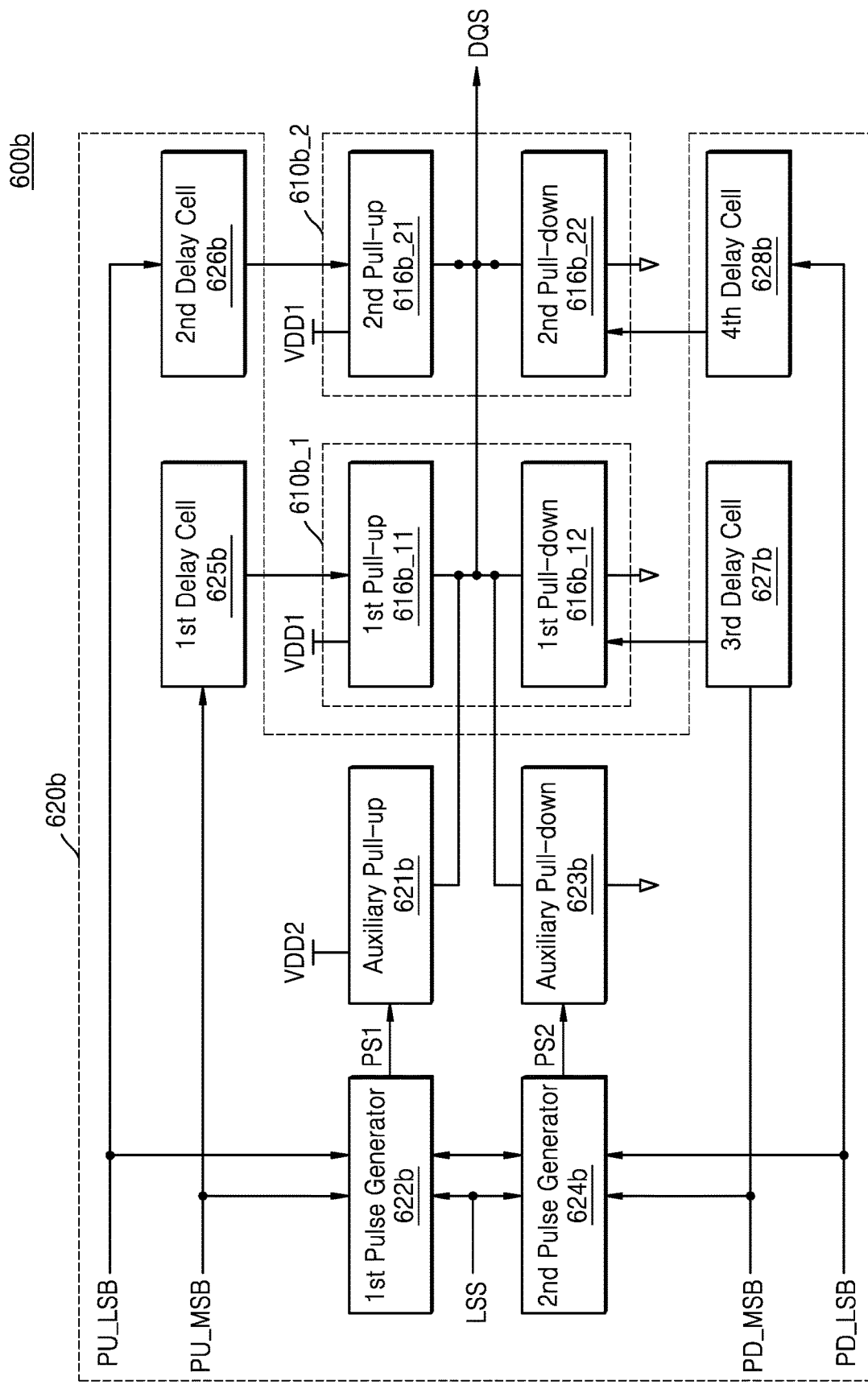
FIG. 14 is a block diagram of a driver configured to generate a pulse signal so as to match a level transition timing of a DQS signal, according to example embodiments of the inventive concept.

FIG. 14 is a block diagram of a driver 600b configured to generate the first and second pulse signals PS1 and PS2 so as to match a level transition timing of the DQS signal DQS, according to example embodiments of the inventive concept. Hereinafter, a description made with reference to the configuration of the driver 600a of FIG. 12 is not repeated.

Referring to FIG. 14, compared to FIG. 12, a slope adjustment circuit 620b of the driver 600b may further include first to fourth delay cells 625b to 628b. A first pulse generator 622b may receive the level selection signal LSS, the pull-up MSB signal PU_MSB, and the pull-up LSB signal PU_LSB, and then generate the first pulse signal PS1 based on the level selection signal LSS, the pull-up MSB signal PU_MSB, and the pull-up LSB signal PU_LSB, and subsequently provide the first pulse signal PS1 to an auxiliary pull-up circuit 621b. The auxiliary pull-up circuit 621b may adjust a slope when the DQS signal DQS transitions from the low level to the high level, based on the first pulse signal PS1. The first and second delay cells 625b and 626b may delay the pull-up MSB signal PU_MSB and the pull-up LSB signal PU_LSB by a certain time and provide the delayed pull-up MSB signal PU_MSB and the delayed pull-up LSB signal PU_LSB to first and second pull-up circuits 616b_11 and 616b_21, respectively. The first and second pull-up circuits 616b_11 and 616b_21 may output the DQS signal DQS in response to the delayed pull-up MSB signal PU_MSB and the delayed pull-up LSB signal PU_LSB. By the configuration described above, the first pulse generator 622b may generate the first pulse signal PS1 in advance to meet a transition timing of the DQS signal DQS, so that the auxiliary pull-up circuit 621b adjusts the level transition slope of the DQS signal DQS.

A second pulse generator 624b may receive the level selection signal LSS, the pull-down MSB signal PD_MSB, and the pull-down LSB signal PD_LSB, and then generate the second pulse signal PS2 based on the level selection signal LSS, the pull-down MSB signal PD_MSB, and the pull-down LSB signal PD_LSB, and subsequently provide the second pulse signal PS2 to an auxiliary pull-down circuit 623b. The auxiliary pull-down circuit 623b may adjust a slope when the DQS signal DQS transitions from the high level to the low level, based on the second pulse signal PS2. The third and fourth delay cells 627b and 628b may delay the pull-down MSB signal PD_MSB and the pull-down LSB signal PD_LSB by a certain time and provide the delayed pull-down MSB signal PD_MSB and the delayed pull-down LSB signal PD_LSB to first and second pull-down circuits 616b_12 and 616b_22, respectively. The first and second pull-down circuits 616b_12 and 616b_22 may output the DQS signal DQS in response to the delayed pull-down MSB signal PD_MSB and the delayed pull-down LSB signal PD_LSB. By the configuration described above, the second pulse generator 624b may generate the second pulse signal PS2 in advance to meet a transition timing of the DQS signal DQS, so that the auxiliary pull-down circuit 623b adjusts the level transition slope of the DQS signal DQS.

However, the embodiments shown in FIG. 14 are only illustrative, and thus, various embodiments for generating the first and second pulse signals PS1 and PS2 to meet a level transition timing of the DQS signal DQS may be applied.

Figure 15:
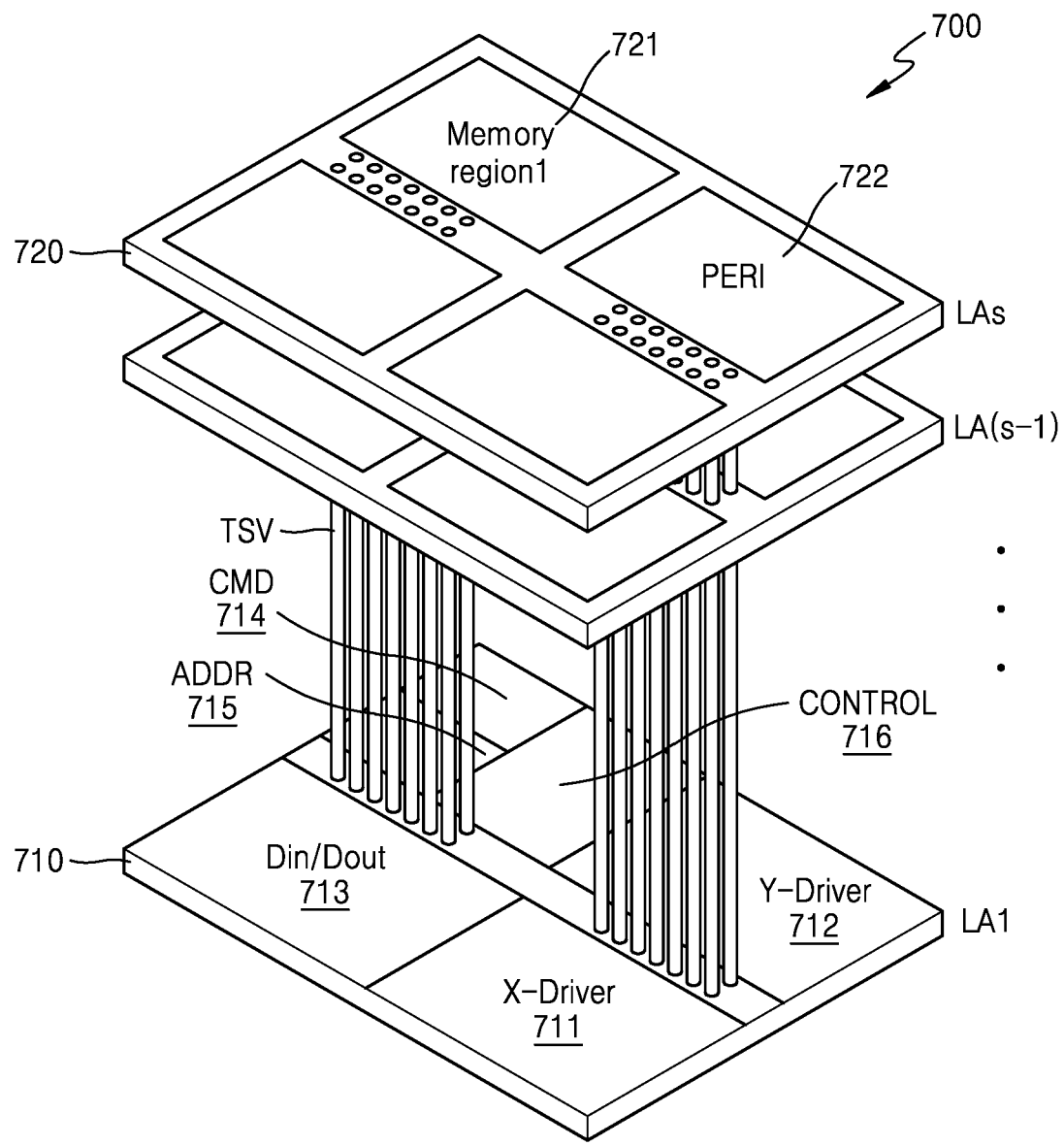
FIG. 15 is a structural diagram of a memory device according to example embodiments of the inventive concept.

FIG. 15 is a structural diagram of a memory device 700 according to example embodiments of the inventive concept.

Referring to FIG. 15, the memory device 700 may include a plurality of semiconductor layers LA1 to LAs (s is an integer of 2 or more), the semiconductor layer LA1 at the bottom is assumed to be a master chip, and the remaining semiconductor layers LA2 to LAs are assumed to be slave chips. The plurality of semiconductor layers LA1 to LAs transmit and receive signals to and from each other through silicon vias TSV, and the master chip LA1 communicates with an external memory controller (not shown) through a conductive means (not shown) formed on an outer surface of the master chip LA1. A configuration and an operation of the memory device 700 will now be described by mainly describing a first semiconductor layer 710 as the master chip and an sth semiconductor layer 720 as a slave chip.

The first semiconductor layer 710 may include various kinds of peripheral circuits configured to drive memory regions 721 provided in slave chips. For example, the first semiconductor layer 710 may include a row driver (X-Driver) 711 configured to drive a word line of a memory, a column driver (Y-Driver) 712 configured to drive a bit line of the memory, a data input/output circuit 713 configured to control an input/output of data, a command buffer 714 configured to receive the command CMD from the outside and buffer the command CMD, an address buffer 715 configured to receive an address from the outside and buffer the address, and the like.

The data input/output circuit 713 may include a DQS generator according to the example embodiments of the inventive concept. The data input/output circuit 713 may generate a DQS signal including a toggle pattern matched or associated with an operating condition of the memory device 700 based on PAMn and output the DQS signal. Furthermore, the data input/output circuit 713 may receive, from the outside, a DQS signal to which the technical idea of the inventive concept is applied.

In addition, the first semiconductor layer 710 may further include a control logic circuit 716. The control logic circuit 716 may control access to the memory regions 721 based on a command and an address signal provided from the memory controller (not shown). The control logic circuit 716 may generate operating information indicating the operating condition of the memory device 700 to generate a DQS signal according to the example embodiments of the inventive concept and provide the generated operating information to the DQS generator in the data input/output circuit 713.

The sth semiconductor layer 720 may include the memory regions 721 and a peripheral circuit region 722 in which other peripheral circuits, e.g., a row decoder, a column decoder, and a bit line sense amplifier (not shown), for reading/writing data of the memory regions 721, are arranged.

In addition, a three-dimensional memory array may be provided to the memory device 700. The three-dimensional memory array may have, formed in a monolithic scheme, one or more memory cell arrays of a physical level, which have an active area arranged on a silicon substrate, and circuits associated with an operation of the memory cell arrays. Herein, the term 'monolithic' indicates that each level of an array including a plurality of layers is directly stacked on a lower layer. In the three-dimensional memory array, word lines and/or bit lines are shared between levels.

Figure 16:
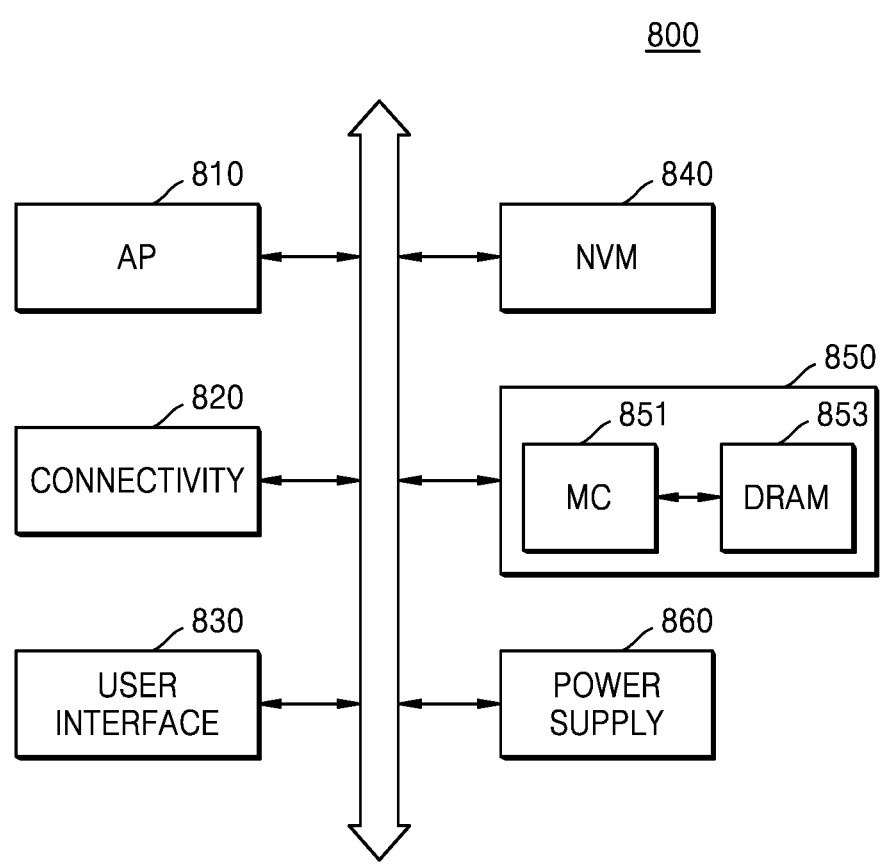
FIG. 16 is a block diagram of a mobile system according to example embodiments of the inventive concept.

FIG. 16 is a block diagram of a mobile system 800 according to example embodiments of the inventive concept.

Referring to FIG. 16, the mobile system 800 may include an application processor 810, a connectivity interface 820, a user interface 830, a nonvolatile memory device 840, a memory sub-system 850, and a power supply 860. The memory sub-system 850 may include a memory controller 851 and a memory device 853 such as dynamic random access memory (DRAM). According to some embodiments of the inventive concept, the mobile system 800 may be a random mobile system such as a mobile phone, a smartphone, a personal digital assistant (PDA), a portable multimedia player (PMP), a digital camera, a music player, a portable game console, or a navigation system.

The application processor 810 may execute applications for providing an Internet browser, a game, a video, and the like. According to embodiments of the inventive concept, the application processor 810 may include a single process core (single core) or multiple processor cores (multi-core). For example, the application processor 810 may include a multi-core such as a dual-core, a quad-core, or a hexa-core. In addition, according to embodiments of the inventive concept, the application processor 810 may further include a cache memory located inside or outside application processor 810.

The connectivity interface 820 may perform wired or wireless communication with an external device. For example, the connectivity interface 820 may perform Ethernet communication, near field communication (NFC), radio frequency identification (RFID) communication, mobile telecommunication, memory card communication, universal serial bus (USB) communication, or the like. For example, the connectivity interface 820 may include a baseband chipset and support communication such as Global System for Mobile Communications (GSM), General Packet Radio Service (GPRS), Wideband Code Division Multiple Access (WCDMA), or High Speed Packet Access (HSxPA).

The memory sub-system 850 may store data processed by the application processor 810 or operate as a working memory. For example, the memory device 853 in the memory sub-system 850 may include DRAM such as double data rate synchronous dynamic random access memory (DDR SDRAM), low power double data rate synchronous dynamic random access memory (LPDDR SDRAM), graphics double data rate synchronous dynamic random access memory (GDDR SDRAM), or rambus dynamic random access memory (RDRAM). The memory sub-system 850 may be implemented by the memory system 10 of FIG. 1. Therefore, the memory sub-system 850 may operate by using a DQS signal based on PAMn, which includes a toggle pattern matched or associated with an operating condition of the memory sub-system 850 or the application processor 810, as described with reference to FIG. 1 and the like.

The nonvolatile memory device 840 may store a boot image for booting the mobile system 800. For example, the nonvolatile memory device 840 may be implemented by electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), ferroelectric random access memory (FRAM), or a similar memory.

The user interface 830 may include one or more input devices such as a keypad and a touch screen and/or one or more output devices such as a speaker and a display device. The power supply 860 may supply an operating voltage of the mobile system 800. In addition, according to example embodiments of the inventive concept, the mobile system 800 may further include a camera image processor (CIS) and a storage device such as a memory card, a solid state drive or solid state disk (SSD), a hard disk drive (HDD), or compact disk read-only memory (CD-ROM). According to example embodiments of the inventive concept, a DQS signal used by the mobile system 800 may include a toggle pattern based on a power state of the power supply 860.

The mobile system 800 or components of the mobile system 800 may be mounted by using various forms of packages, e.g., package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (PMQFP), thin quad flat-pack (TQFP), small outline integrated circuit (SOIC), shrink small outline package (S SOP), thin small outline package (TSOP), thin quad flat-pack (TQFP), system in package (SIP), multi-chip package (MCP), wafer-level fabricated package (WFP), or wafer-level processed stack package (WSP).

Figure 17:
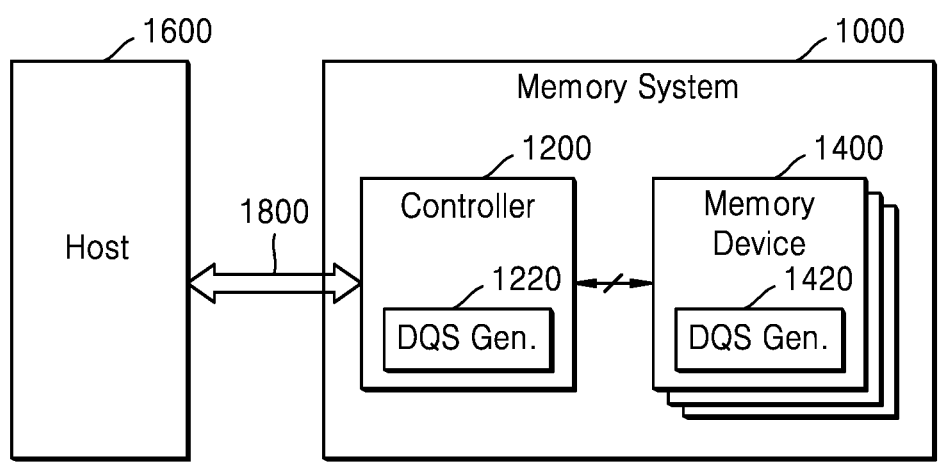
FIG. 17 is a block diagram of systems including a DQS generator, according to example embodiments of the inventive concept.

FIG. 17 is a block diagram of systems including a DQS generator, according to example embodiments of the inventive concept. As shown in FIG. 17, a memory system 1000 and a host system 1600 may communicate through an interface 1800, and the memory system 1000 may include a memory controller 1200 and memory devices 1400.

The interface 1800 may use an electrical signal and/or an optical signal and may be implemented by, as a non-limited example, a serial advanced technology attachment (SATA) interface, a SATA express (SATAe) interface, a serial attached small computer system interface (serial attached SCSI) (SAS), a USB interface, or a combination thereof. The host system 1600 and the memory controller 1200 may include SerDes for serial communication.

According to some embodiments of the inventive concept, the memory system 1000 may communicate with the host system 1600 by being removably coupled to the host system 1600. The memory device 1400 may include a volatile memory or a nonvolatile memory, and the memory system 1000 may be referred to as a storage system. For example, the memory system 1000 may be implemented by, as a non-limited example, an SSD, an embedded SSD (eSSD), a multimedia card (MMC), an embedded MMC (eMMC), or the like. The memory controller 1200 may control the memory devices 1400 in response to a request received from the host system 1600 through the interface 1800.

DQS generators 1220 and 1420, to which the example embodiments of the inventive concept are applied, may be implemented to be included in the memory controller 1200 and the memory devices 1400, respectively.

While the inventive concept has been particularly shown and described with reference to embodiments thereof, it will be understood that various changes in form and details may be made therein without departing from the scope of the following claims.

What is claimed is:

1. A memory device comprising:
   a memory cell array; and
   a data input and output circuit configured to output a data signal (DQ signal) comprising data read from the memory cell array, and a data strobe signal (DQS signal) comprising a toggle pattern corresponding to an operating condition of the memory device based on n-level pulse amplitude modulation (PAMn),
   wherein n is an integer greater than or equal to 4.

2. The memory device of claim 1, wherein the operating condition of the memory device comprises at least one of an operating frequency of the memory device, a power state of the memory device, or a pattern of the DQ signal.

3. The memory device of claim 1, wherein the data input and output circuit is further configured to output first and second DQS signals comprising first and second toggle patterns in response to first and second read commands received under different operating conditions of the memory device, respectively.

4. The memory device of claim 3, wherein a toggle pattern interval of the first toggle pattern is different from a toggle pattern interval of the second toggle pattern.

5. The memory device of claim 3, wherein at least one of a first toggle low level and a first toggle high level of the first toggle pattern is different from a second toggle low level and a second toggle high level of the second toggle pattern.

6. The memory device of claim 1,
   wherein the DQ signal comprises first and second data patterns associated with respective data unit groups,
   wherein the first and second data patterns are different from each other, and
   wherein the DQS signal comprises first and second toggle patterns corresponding to the first and second data patterns, respectively, and different from each other.

7. The memory device of claim 6, wherein the first and second toggle patterns comprise at least three voltage levels.

8. The memory device of claim 1, wherein the memory device is configured to receive, from a memory controller, a signal indicating the operating condition of the memory device.

9. The memory device of claim 1,
   wherein the data input and output circuit comprises a DQS generator configured to generate the DQS signal, and
   wherein the DQS generator comprises:
   a PAM circuit configured to generate a level selection signal associated with the DQS signal, based on the operating condition of the memory device;
   a level selector configured to generate a plurality of pull-up bit signals and a plurality of pull-down bit signals based on the level selection signal; and
   a driver configured to output the DQS signal based on the plurality of pull-up bit signals and the plurality of pull-down bit signals.

10. The memory device of claim 9, wherein the data input and output circuit further comprises a slope adjustment circuit connected to the driver and configured to adjust a level transition slope of the DQS signal based on a toggle level interval of the toggle pattern.

11. The memory device of claim 10, wherein the slope adjustment circuit comprises:
a pulse generator configured to generate first and second pulse signals associated with a transition timing comprising rising and/or fall edges of the toggle pattern, based on the level selection signal; and
an auxiliary circuit configured to generate an adjustment signal for adjusting the level transition slope, based on the first and second pulse signals, and further configured to provide the adjustment signal to the driver.

12. The memory device of claim 9,
wherein the driver comprises two pull-up circuits and two pull-down circuits when the PAMn comprises PAM 4, and
wherein the two pull-up circuits comprise a plurality of pMOS transistors and the two pull-down circuits comprise a plurality of nMOS transistors.

13. The memory device of claim 9, wherein the data input and output circuit further comprises a transmitter configured to output the DQ signal synchronized with the DQS signal.

14. A memory system comprising:
a memory device comprising a memory cell array; and
a memory controller configured to control a memory operation of the memory device,
wherein the memory device and the memory controller each transmit and receive a data strobe signal (DQS signal) comprising a different toggle pattern according to an operating condition of the memory system based on n-level pulse amplitude modulation (PAMn), and
wherein n is an integer greater than or equal to 4.

15. The memory system of claim 14,
wherein the toggle pattern has a toggle level interval adjusted according to PAMn based on the operating condition of the memory system, and
wherein the operating condition of the memory device comprises at least one of an operating frequency of the memory device, a power state of the memory device, or a pattern of the DQS signal.

16. The memory system of claim 14, wherein the toggle pattern has a toggle low level and a toggle high level adjusted according to PAMn based on the operating condition of the memory system.

17. The memory system of claim 14,
wherein the memory device and the memory controller are configured to transmit and receive, to and from each other, a data signal (DQ signal) comprising data for programming to the memory cell array or data read from the memory cell array,
wherein the DQ signal comprises a plurality of data patterns that are associated with respective data unit groups, and
wherein the DQS signal comprises a plurality of toggle patterns corresponding to the plurality of data patterns, respectively, and comprising at least three voltage levels.

18. A method of operating a memory device, the method comprising:
receiving a first read command corresponding to a first operating condition;
outputting, in response to the first read command, a first data signal (DQ signal) and a first data strobe signal (DQS signal) based on n-level pulse amplitude modulation (PAMn) and corresponding to the first operating condition;
receiving a second read command corresponding to a second operating condition that is different from the first operating condition; and
outputting, in response to the second read command, a second DQ signal and a second DQS signal based on PAMn and corresponding to the second operating condition,
wherein the first DQS signal has a first toggle pattern different from a second toggle pattern of the second DQS signal.

19. The method of claim 18, wherein a toggle level interval of the first DQS signal is different from a toggle level interval of the second DQS signal.

20. The method of claim 18, wherein at least one of a first toggle low level and a first toggle high level of the first DQS signal is different from a second toggle low level and a second toggle high level of the second DQS signal.

* * * * *